(12) United States Patent
Ecton

(10) Patent No.: US 11,569,160 B2
(45) Date of Patent: Jan. 31, 2023

(54) PATTERNING OF DUAL METALLIZATION LAYERS

(71) Applicant: Intel Corporation, Santa Clara, CA (US)

(72) Inventor: Jeremy Ecton, Gilbert, TX (US)

(73) Assignee: Intel Corporation, Santa Clara, CA (US)

( * ) Notice: Subject to any disclaimer, the term of this patent is extended or adjusted under 35 U.S.C. 154(b) by 1090 days.

(21) Appl. No.: 16/001,482

(22) Filed: Jun. 6, 2018

(65) Prior Publication Data

US 2019/0378789 A1  Dec. 12, 2019

(51) Int. Cl.
*H01L 23/498* (2006.01)
*H01L 21/48* (2006.01)

(52) U.S. Cl.
CPC .... *H01L 23/49838* (2013.01); *H01L 21/4846* (2013.01); *H01L 23/49866* (2013.01)

(58) Field of Classification Search
CPC ......... H01L 23/49838; H01L 23/49866; H01L 23/49822; H01L 23/538; H01L 21/4846; H01L 21/4857
See application file for complete search history.

(56) References Cited

U.S. PATENT DOCUMENTS

| | | | | | |
|---|---|---|---|---|---|
| 5,736,456 A | * | 4/1998 | Akram | ............ | H01L 24/03 438/959 |
| 5,939,789 A | * | 8/1999 | Kawai | ............ | H01L 21/4857 257/762 |
| 6,800,947 B2 | * | 10/2004 | Sathe | ............ | H01L 23/4985 257/784 |
| 8,227,710 B2 | * | 7/2012 | Nagase | ............ | H01L 23/5389 174/262 |
| 8,399,779 B2 | * | 3/2013 | Ogawa | ............ | H01L 23/49822 174/262 |
| 9,318,460 B2 | * | 4/2016 | Sakuma | ............ | H01L 21/4853 |
| 2008/0202803 A1 | * | 8/2008 | Nagase | ............ | H01L 23/5389 174/262 |
| 2020/0315003 A1 | * | 10/2020 | Lee | ............ | H05K 3/381 |

* cited by examiner

Primary Examiner — Dale E Page
Assistant Examiner — Quovaunda Jefferson
(74) *Attorney, Agent, or Firm* — Akona IP PC

(57) ABSTRACT

Embodiments may relate to a semiconductor package that includes a routing trace coupled with a substrate. The routing trace may be linear on a side of the routing trace between the substrate and a top of the routing trace. The semiconductor package may further include a power trace coupled with the substrate. The power trace may be concave on a side of the power trace between the substrate and a top of the power trace. Other embodiments may be described and/or claimed.

25 Claims, 14 Drawing Sheets

PATTERNING OF DUAL METALLIZATION LAYERS

FIELD

Embodiments of the present disclosure generally relate to the field of semiconductor packages, and more particularly to patterning in said packages.

BACKGROUND

Semiconductor packages may include a plurality of metal traces. Generally, the traces may include traces designated for the routing of power (referred to herein as "power traces") and traces designated for the routing of signals (referred to herein as "routing traces"). In various embodiments, it may be desirable for the power traces to have a relatively large cross sectional area in the direction of current transfer. This relatively large cross sectional area may provide a reduced direct current resistance (RDC), which may allow current to travel through the power trace with increased efficiency. The increased efficiency may have benefits such as enabling a longer battery life, requiring less power, etc.

DETAILED DESCRIPTION

Figure 1:
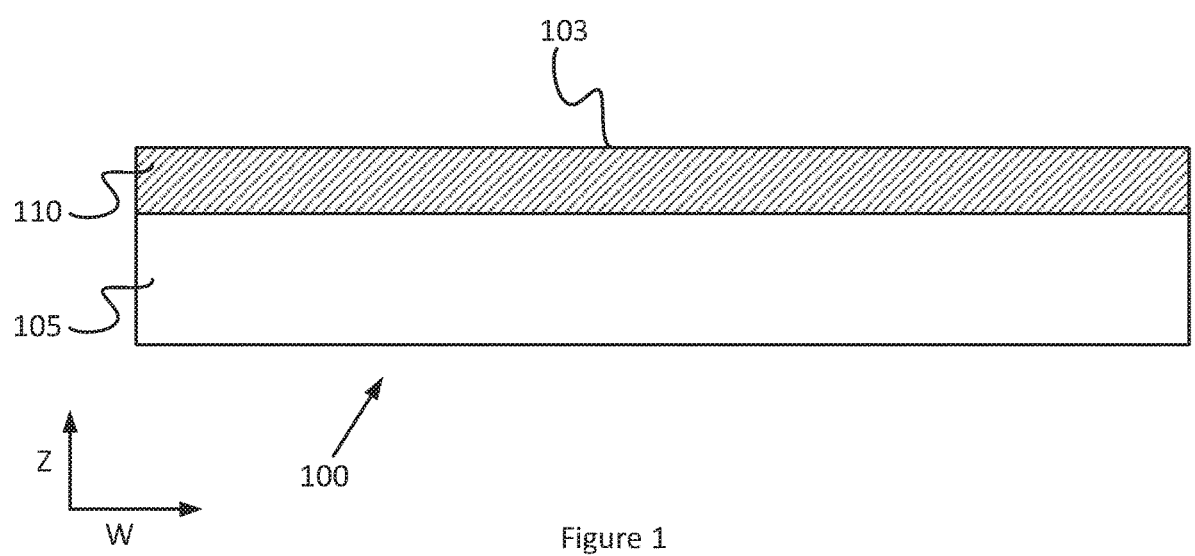
FIG. 1 illustrates a stage of manufacturing a package with a dual metal thickness power trace, in accordance with various embodiments.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A or B" means (A), (B), or (A and B). For the purposes of the present disclosure, the phrase "A, B, or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, the phrase "a first feature formed, deposited, or otherwise disposed on a second feature," may mean that the first feature is formed, deposited, or disposed over the feature layer, and at least a part of the first feature may be in direct contact (e.g., direct physical or electrical contact) or indirect contact (e.g., having one or more other features between the first feature and the second feature) with at least a part of the second feature.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an application specific integrated circuit (ASIC), an electronic circuit, a processor (shared, dedicated, or group) or memory (shared, dedicated, or group) that execute one or more software or firmware programs, a combinational logic circuit, or other suitable components that provide the described functionality.

Embodiments herein may be described with respect to various Figures. Unless explicitly stated, the dimensions of the Figures are intended to be simplified illustrative examples, rather than depictions of relative dimensions. For example, various lengths/widths/heights of elements in the Figures may not be drawn to scale unless indicated otherwise.

As noted above, it may be desirable to reduce the RDC of the power traces of a semiconductor package to provide benefits such as increased efficiency, increased battery life, reduced power requirements, etc. One technique which may be used to do so is to use a "dual metal thickness" layer for the power trace. A dual metal thickness layer may result from a double plating patterning process. In other words, a first layer of the power trace may be plated, and then a second layer may be plated on top of the first layer to create a power trace that is higher than could be produced using a single plating process.

Generally, as used herein, a power trace may refer to a trace that is to route power between a component coupled with the power trace and a power supply. Such a component may include, for example, memory, a processor, etc. As used herein, a routing trace may refer to a trace that is to carry data signals to or from a component coupled with the routing trace. For example, the routing traces may carry data signals between various processors, memory, etc. Generally, elements herein may be referred to as "traces," however in some embodiments certain of the depicted elements may be pads, vias, bumps, etc.

One approach that has been used to enable a thin metallization pattern residing near a thick metallization pattern (referred to herein as "dual metal thickness pattern") within a standard metallization layer and via layer layer stack up, in legacy semiconductor packages, has been to first generate a first layer of the dual metal thickness trace using a semi-additive plating (SAP) technique. The resist pattern that defines the power trace may then be expanded so that both the top and the sides of the first layer are exposed, and a second SAP technique may be applied. This second layer may surround both the top and the sides of the first layer and generate the dual metal thickness layer. However, this technique may provide a disadvantage in that the resultant trace may not have a rectangular cross section, but instead may have a dome shaped cross section. That is, the top of the trace at a central point of the trace may be higher than the top of the trace at a point near the sides of the trace. This dome shaped cross section may be undesirable because it may provide uneven RDC throughout the trace, which in turn may negatively affect the efficiency/battery life/power requirements/etc. benefits of the dual metal thickness layer discussed above.

Embodiments herein may provide a dual metal thickness layer that may improve power delivery performance. The dual metal thickness layer may be the result of both an SAP technique and a subtractive etch (SE) technique. Specifically, the first metal layer of the power traces and routing traces may be patterned using SAP, and the dual metal thickness layer of the power traces may be subsequently generated using SE. By implementing a SE process to pattern the dual metal thickness layer of the power trace, the resultant power trace may have a more rectangular cross section than the dome shaped cross section of legacy dual metal thickness layers.

As used herein, SAP may refer to a technique wherein a thin metal layer may be present on a substrate. A pattern resist may be overlaid on the thin metal layer. The pattern resist may include one or more cavities through which the thin metal layer is accessible. Additional metal may then be plated onto the thin metal layer through the cavities in the resist. The plating may be, for example, via electro plating or some other plating technique wherein additional material may be introduced through the cavities of the resist to produce elements such as traces, vias, pads, etc. on the thin metal layer. The resist may then be removed, leaving the plated elements on the thin metal layer.

As used herein SE may refer to a technique wherein a resist pattern may be deposited over a layer that is to be etched. The resist pattern may have one or more cavities through which the layer that is to be etched is accessible. An etching process may then be performed. The etching process may include, for example, dry or wet chemical etching, mechanical etching, light activated etching, or some other type of etching. In some embodiments the etching process may be performed without the resist pattern. The etch process may remove portions of the layer that is to be etched through the openings in the resist pattern. The resist pattern may then be removed and the portions of the layer that were under the resist pattern may remain behind. Those portions may be elements such as traces, pads, etc.

FIGS. 1-10 provide examples of a package 100 during a manufacturing process that includes both an SAP and a SE technique to produce a power trace with a generally rectangular cross sectional area. Generally, FIGS. 1-10 will be described with respect to certain reference numerals that may not be repeated in each Figure for the sake of clarity. In other words, if an element is numbered and described in one of the FIGS. 1-10, it may be assumed to be the same element in another of FIGS. 1-10 even if it is not clearly re-enumerated or specifically called out. Additionally, in Figures such as FIG. 2 each and every element may not be specifically enumerated for the sake of eliminating clutter of Figures. For example, in FIG. 2 four resist elements may be depicted, but only three of the resist elements (115, 116, and 120) are specifically enumerated. However, it will be clear from similarities of shading, and the resultant description, that the non-enumerated resist elements in FIG. 2 may reasonably share properties of the enumerated elements.

Figure 8:
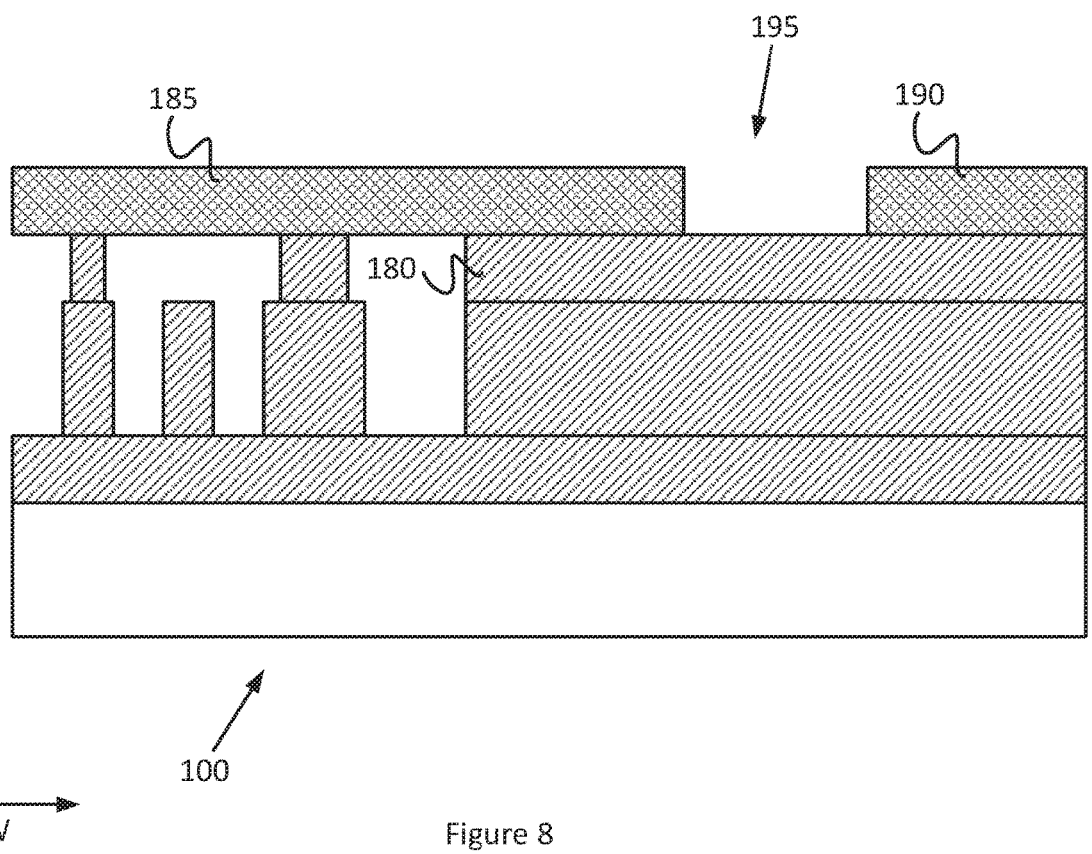
FIG. 8 illustrates a stage of manufacturing a package with a dual metal thickness power trace, in accordance with various embodiments.
Figure 9:
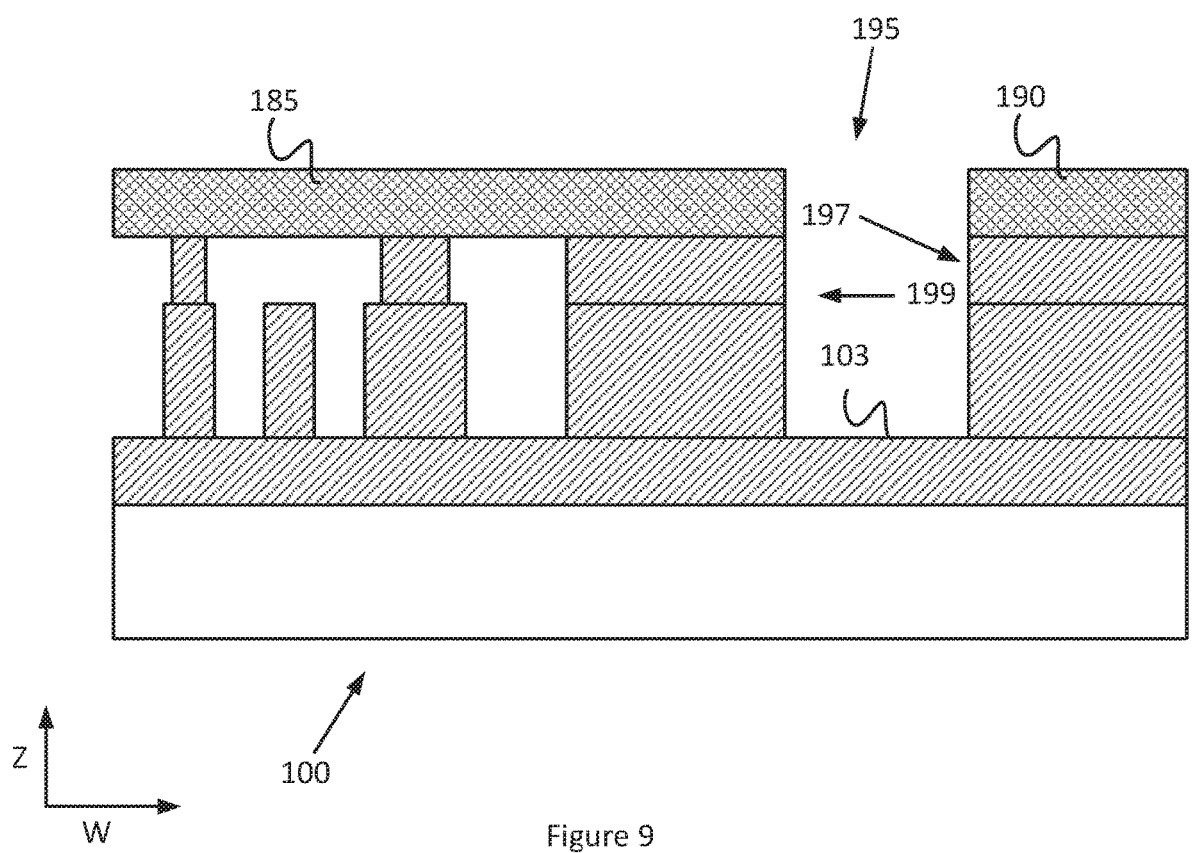
FIG. 9 illustrates a stage of manufacturing a package with a dual metal thickness power trace, in accordance with various embodiments.
Figure 10:
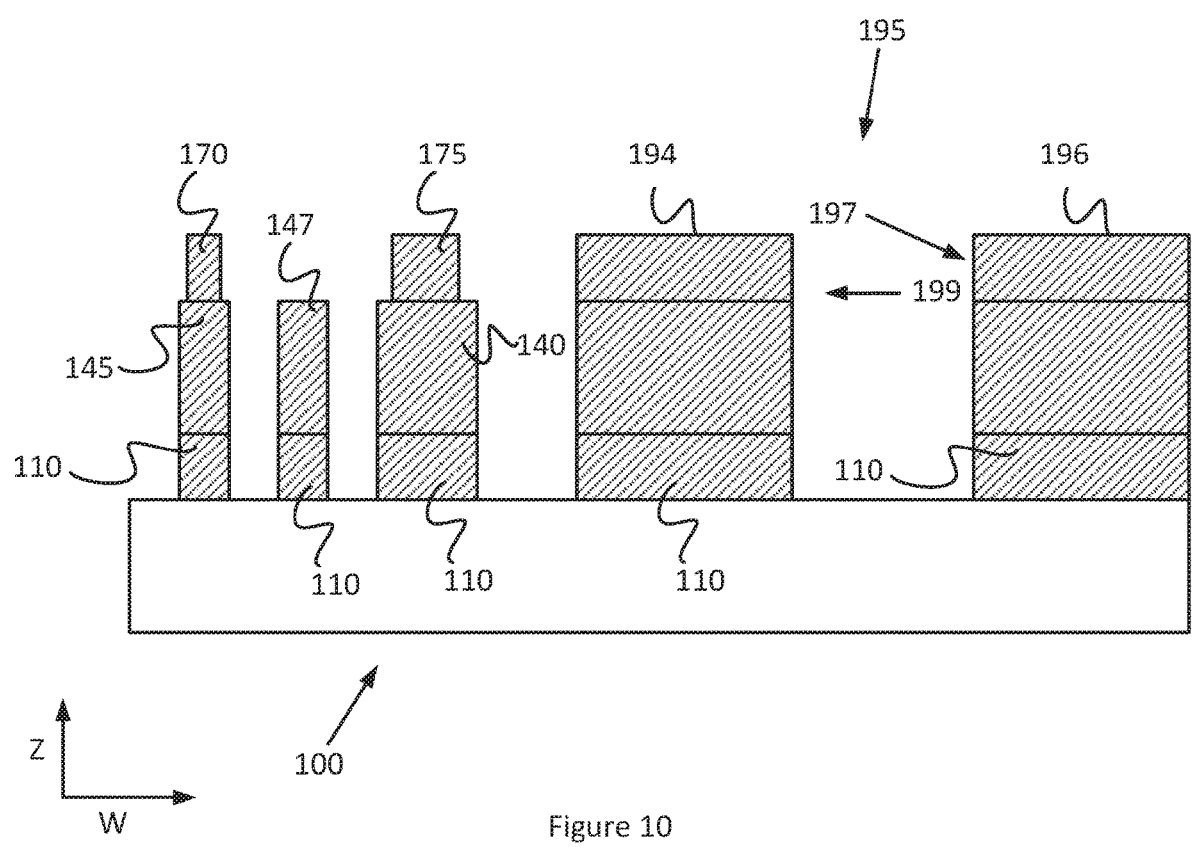
FIG. 10 illustrates an example package with a dual metal thickness power trace, in accordance with various embodiments.
Figure 11:
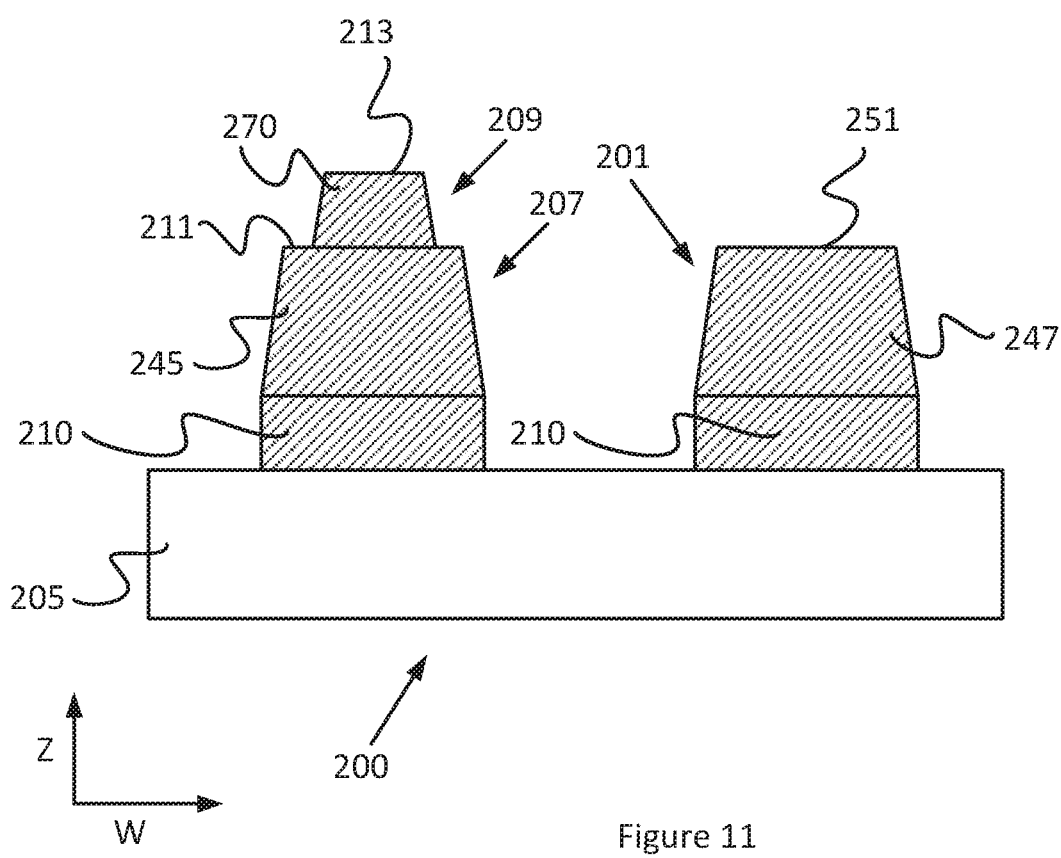
FIG. 11 illustrates a detailed portion of a routing trace, in accordance with various embodiments.
Figure 12:
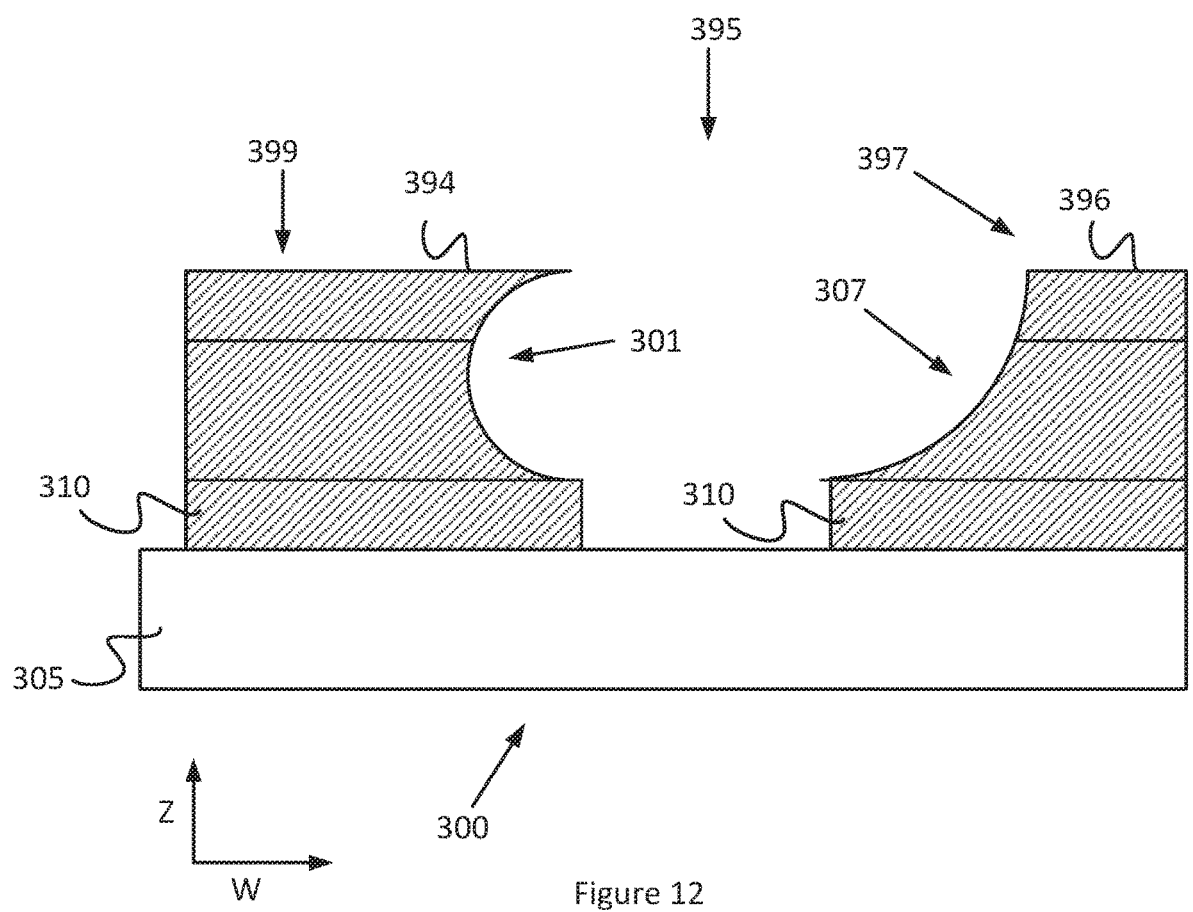
FIG. 12 illustrates a detailed portion of a power trace, in accordance with various embodiments.

Additionally, it will be understood that in the various FIGS. 1-12, and particularly FIGS. 10, 11, and 12 depict routing or power traces through which current may flow. Specifically, the current may flow through the traces in the direction into or out of the page, that is perpendicularly to the illustrated "Z" and "W" axes. The generally described "rectangular" cross-sections, by contrast, may be in the direction of the "Z" and "W" axes.

FIG. 1 depicts an initial stage of a package 100 that may include a substrate 105 with a metal layer 110 thereon. The metal layer 110 may include a surface 103. In embodiments, the substrate 105 may be a cored or coreless substrate of a semiconductor package. The substrate 105 may be composed of one or more layers that may have various routing features such as routing layers, vias, etc. therein. The substrate 105 may additionally or alternatively have one or more elements such as microchips or other elements therein. In embodiments, the one or more layers of the substrate 105 may be composed of a dielectric material such as a polymer, an epoxy, Ajimoto build-up film (ABF), or some other material. The substrate 105 may have a z-height (as measured in the direction indicated by "Z" in FIG. 1) between approximately 50 micrometers ("microns" or "μm") and approximately 1000 microns.

The metal layer 110 may be considered to be a "seed" layer for the SAP technique described above, and may be a conductive material such as gold, copper, alloys thereof, or some other conductive material. Generally, the metal layer 110 may have a z-height on the order of a few microns. For example, in embodiments the metal layer 110 may have a z-height between approximately 1 and approximately 5 microns.

Figure 2:
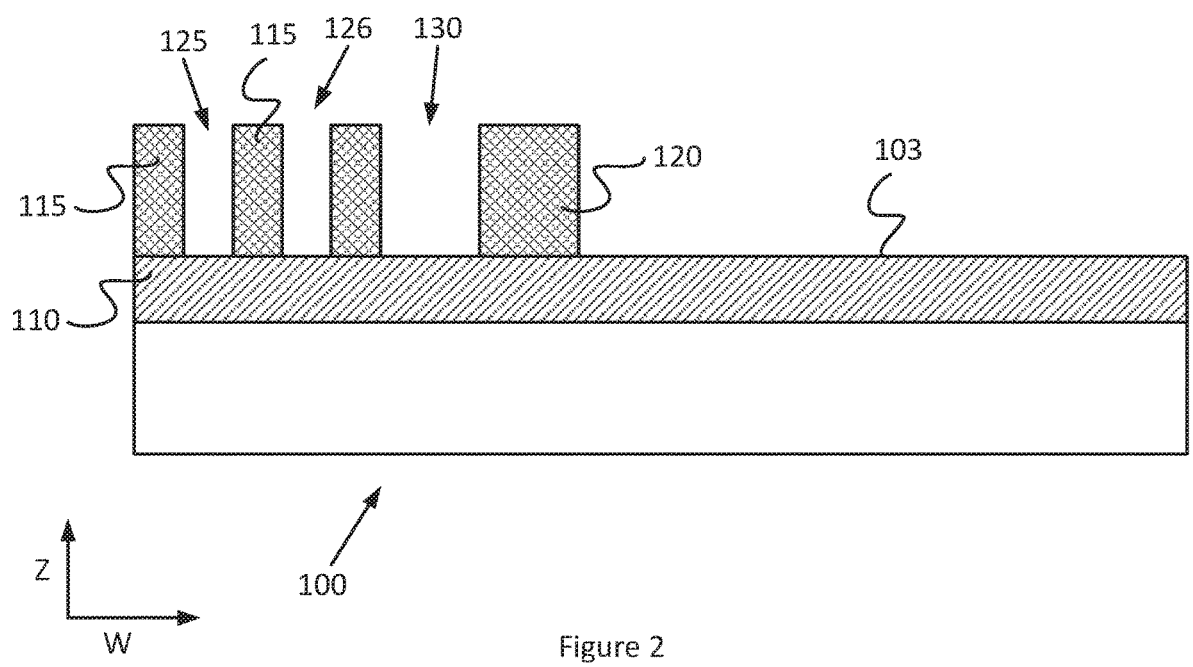
FIG. 2 illustrates a stage of manufacturing a package with a dual metal thickness power trace, in accordance with various embodiments.

In FIG. 2, resist elements such as resist elements 115, 116, and 120 may be positioned on metal layer 110. In embodiments, the resist elements 115, 116, or 120 may be, for example, a resist material such as a polymer, an epoxy, a dielectric material, a photo imageable dielectric (PID) material, or some other resist material. The resist material may be positioned on the metal layer 110 via a technique such as spray deposition, lamination, etc. As can be seen in FIG. 2, the resist elements may not all have the same width (as measured in the direction indicated by "W" in FIG. 2). For example, resist element 120 may be wider than resist element 115. In other embodiments, certain of the resist elements may have the same width, for example resist elements 115 and 116 in FIG. 2. In some embodiments, the resist elements 115/116/120 may have widths on the order of between approximately 2 microns and approximately 400 microns, and heights of between approximately 2 microns and approximately 45 microns. In some embodiments, one or more of the resist elements 115/116/120 may have a height of between approximately 2 microns and approximately 120 microns.

The resist elements 115/116/120 may form one or more cavities such as cavities 125, 126, and 130. As can be seen in FIG. 2, in some embodiments the cavities may have a similar width as one another, for example cavity 125 and cavity 126. In other embodiments, the cavities may have widths that are different from one another, for example cavities 125 and 130. In some embodiments, the cavities may have widths of between approximately 2 microns and approximately 400 microns. As can be seen in FIG. 2, the surface 103 may be accessible through the cavities 125/126/130.

Figure 3:
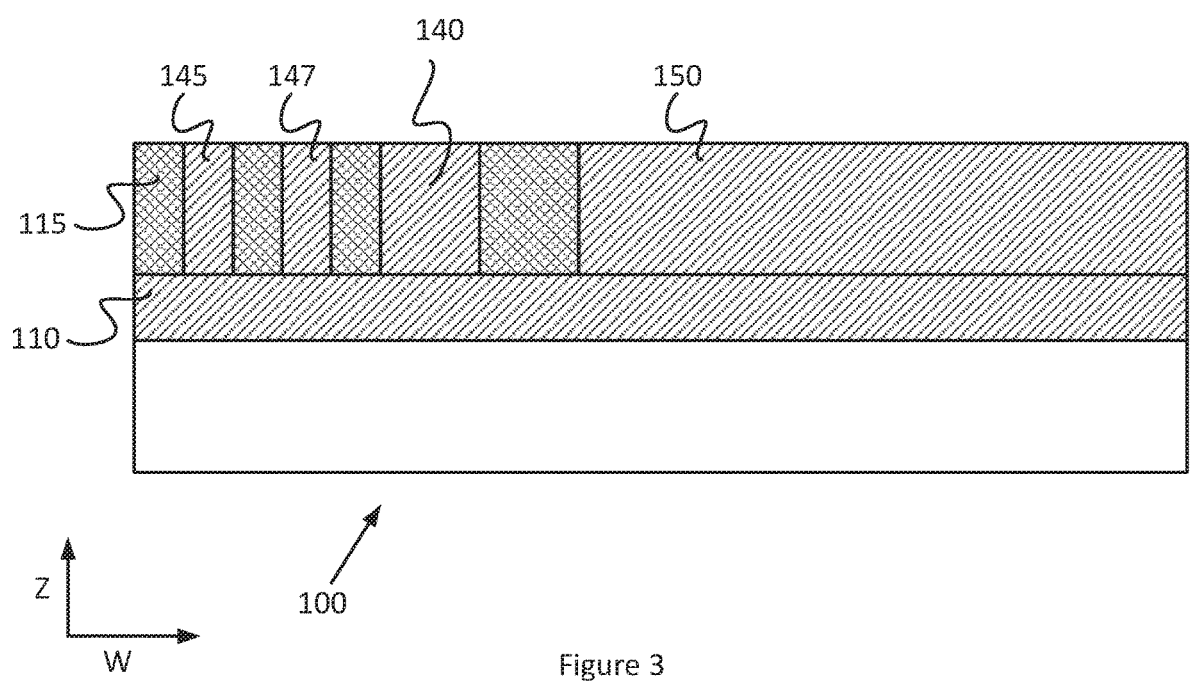
FIG. 3 illustrates a stage of manufacturing a package with a dual metal thickness power trace, in accordance with various embodiments.

As can be seen in FIG. 3, the various cavities 125/126/130 from FIG. 2 may then be filled with additional conductive material in an SAP process. Specifically, the cavities 125/126/130 may be filled with the conductive material to form conductive elements 145, 140, 147, and 150. In some embodiments, the conductive material may be the same material as metal layer 110, while in other embodiments the conductive material may be a different type of conductive material. For example, in some embodiments both the metal layer 110 and one or more of conductive elements 145/140/147/150/etc. may be copper, gold, etc. In other embodiments the metal layer 110 may be a copper seed layer and one or more of conductive elements 145/140/147/150/etc. may be a different conductive material such as gold. In embodiments the conductive elements 145/140/147/150/etc. may be approximately the same z-height as, for example, resist elements such as resist element 115. In other embodiments, the conductive elements 145/140/147/150/etc. may have a lesser z-height than the resist elements. In some embodiments, the conductive elements 145/140/147/150 may be plated via the SAP process so that a layer of the material used to make the conductive elements 145/140/147/150 overlays the resist elements such as resist element 115. The additional conductive material may then be removed by plating, etching, etc. so that the conductive elements 145/140/147/150 and the resist elements have approximately the same z-height as shown in FIG. 3.

Figure 4:
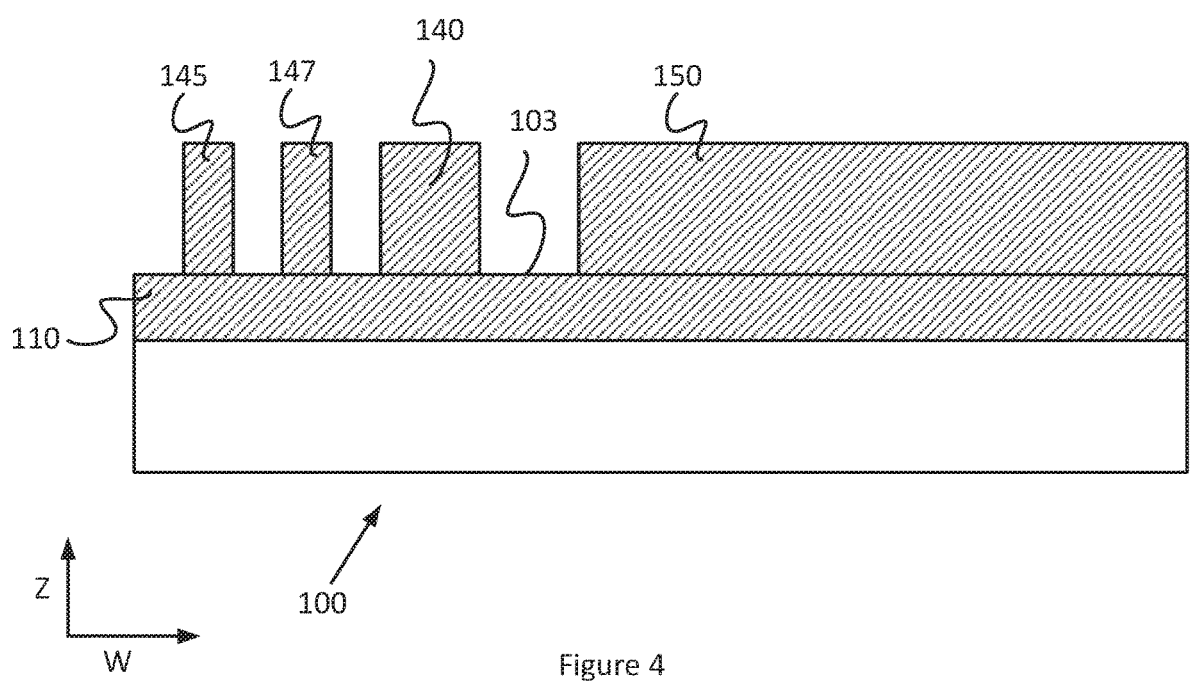
FIG. 4 illustrates a stage of manufacturing a package with a dual metal thickness power trace, in accordance with various embodiments.

As can be seen in FIG. 4, the resist material may be removed, leaving behind conductive elements 145, 140, 147, and 150. More specifically, the resist material such as the material of resist elements 115/116/120/etc. from FIG. 2 may be removed via a process such as a chemical process, a mechanical process, an optical process, etc. The process may be, for example, a chemical etching process, a physical scraping or drilling process, etc. Removal of the resist material may expose the surface 103 of the metal layer 110.

Figure 5:
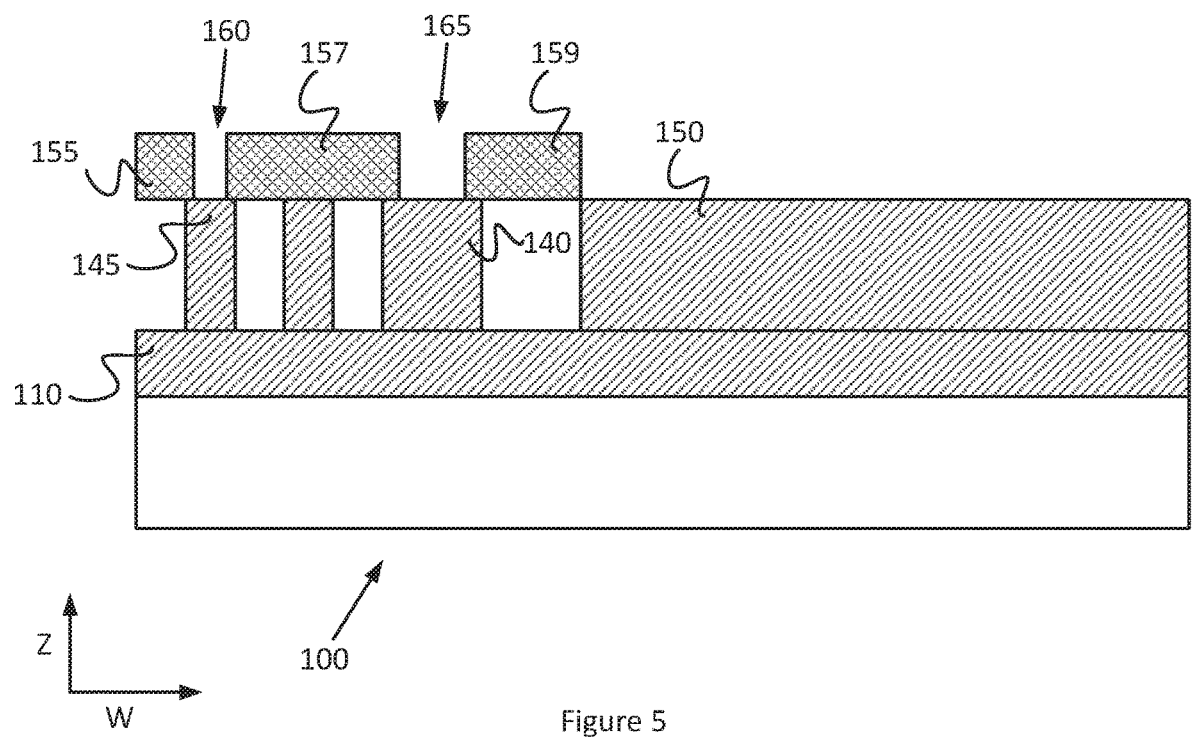
FIG. 5 illustrates a stage of manufacturing a package with a dual metal thickness power trace, in accordance with various embodiments.

Additional resist elements 155, 157, and 159 may then be positioned on the package 100 as shown in FIG. 5. The resist elements 155, 157, or 159 may be the same resist material as that used for resist elements 115, 116, or 120, or may be another one of the resist materials described above. In embodiments, the resist elements 155, 157, or 159 may be positioned on the package 100 via deposition, lamination, etc. As can be seen, the resist elements 155, 157, and 159 may describe cavities such as cavities 160 and 165. In some embodiments the cavities 160 and 165 may have a different width than one another, for example as shown in FIG. 5. In other embodiments the cavities 160 and 165 may have the same width as one another. In some embodiments, the resist elements 155, 157, and 159 may have a z-height of between approximately 2 microns and approximately 45 microns.

Figure 6:
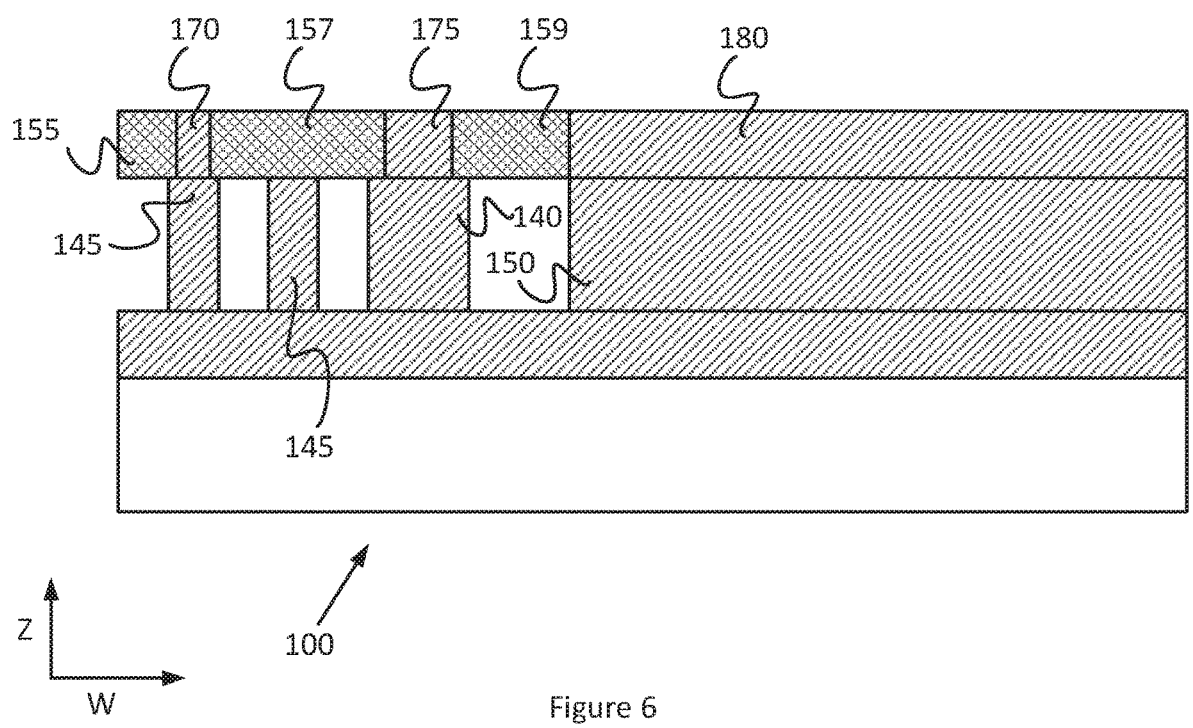
FIG. 6 illustrates a stage of manufacturing a package with a dual metal thickness power trace, in accordance with various embodiments.

Conductive elements 170, 175, and 180 may then be positioned on the package 100 via an SAP technique as shown in FIG. 6. The conductive elements 170, 175, or 180 may be, for example, the same material as conductive elements 145, 140, or 150, while in other embodiments the conductive elements 170, 175, or 180 may be a different one of the conductive material discusses above with respect to metal layer 110. In some embodiments the conductive elements 170, 175, and 180 may be, for example, the same material as metal layer 110, while in other embodiments one or more of the conductive elements 170, 175, and 180 may be a different material than that of metal layer 110. Generally, conductive elements 150 and 180 may together be considered a "power trace block." This may be because the power trace block may be etched via a SE process as discussed later to form one or more power traces.

In some embodiments, conductive elements 170, 175, and 180 may have a z-height of between approximately 2 microns and approximately 45 microns. In some embodiments, conductive elements 170, 175, or 180 may have a same z-height as that of resist elements 155, 157, and 159. In other embodiments one or more of conductive elements 170, 175, or 180 may have a lower z-height than that of resist elements 155, 157, or 159. In some embodiments, as described above, the SAP process may produce a layer of conductive material over resist elements 155, 157, or 159 that is later removed.

As can be seen in FIG. 6, in embodiments the second layer of conductive elements may be positioned over ones of the first layer of conductive elements. However, one or more of the first layer of conductive elements may not have an additional conductive element placed there on. For example, conductive element 147 may be covered by resist element 157, and therefore the SAP process that generates conductive elements 170, 175, and 180 may not generate an additional conductive element on conductive element 147.

Figure 7:
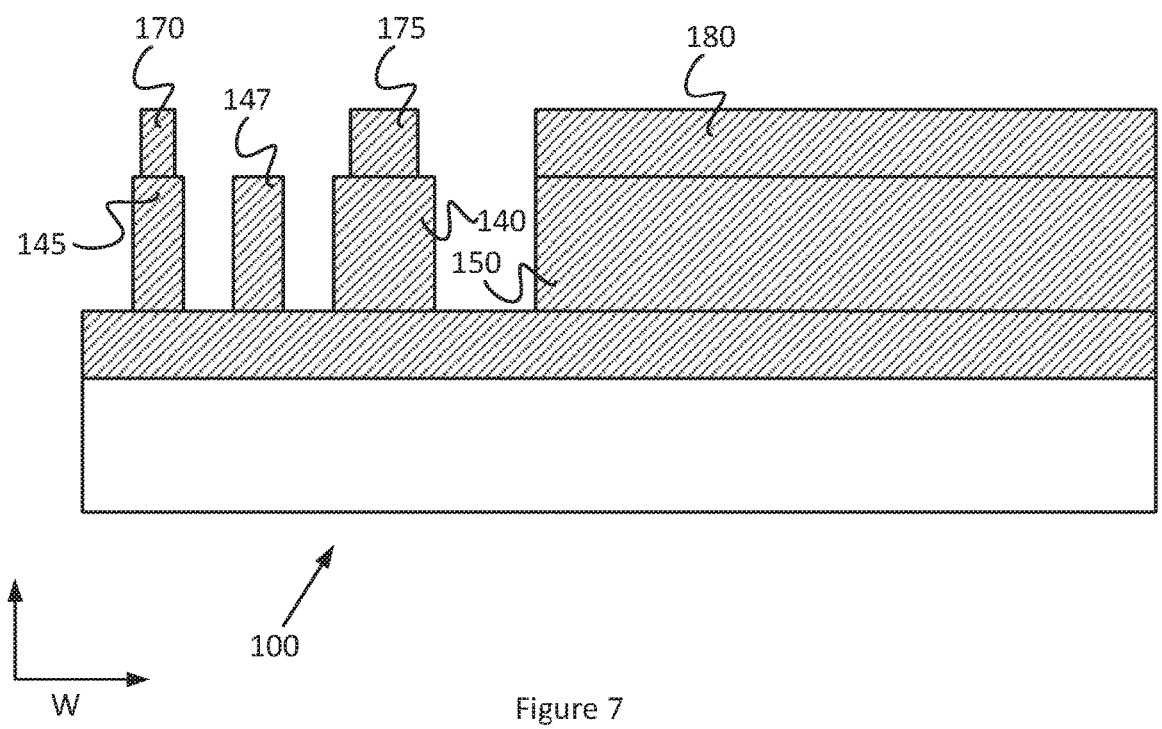
FIG. 7 illustrates a stage of manufacturing a package with a dual metal thickness power trace, in accordance with various embodiments.

As can be seen in FIG. 7, the resist elements 155/157/159/etc. may then be removed. Removal of the resist elements 155/157/159 may include, for example, techniques such as chemical etching, mechanical etching, mechanical drilling, optical etching, etc. The various conductive elements 147, 170, 147, 175, 140, 150, 180 may remain behind and be exposed subsequent to removal of the resist elements.

Generally, the conductive elements 145, 170, 147, 140, and 175 may be said to be routing traces of the package 100. For example, conductive elements 170 and 145 may form one routing trace. Conductive elements 140 and 175 may form another routing trace. Conductive element 147 may form another routing trace. As can be seen in FIG. 7, the routing traces may be different heights or widths from one another. In some embodiments, various of the routing traces may be the same height or width as another of the routing traces.

As can be seen in FIG. 8, additional resist elements 185 and 190 may then be positioned upon the package. Specifically, the resist elements 185/190 may generally cover the various conductive elements of previous Figures and include a cavity through which the conductive element 180 may be exposed. In embodiments, the resist elements 185/190 may have a z-height of between approximately 2 microns and approximately 45 microns. The resist elements 185/190 may be positioned on the package 100 in a manner similar to that described above with respect to other resist elements. For example, the resist elements 185/190 may be deposited via spray deposition, spin coated, lamination, etc. In embodiments, the material of the resist elements 185/190 may be a resist material such as that described above with respect to resist elements 115, 116, or 120.

As can be seen in FIG. 9, a SE process (as described above) may be performed on the package through the cavity 195 to form power traces 197 and 199. More specifically, an etch process such as one or more of the etching processes discussed above may be performed on the package within the cavity 195 on previously described conductive elements 150 and 180 to form the power traces 197 and 199.

As can be seen in FIG. 10, the resist elements 185 and 190 from FIG. 9 may be removed. Specifically, the resist elements 185 and 190 may be removed via a technique such as stripping, mechanical or chemical etching, etc. Additionally, a further etching process may be performed to segment the metal layer 110 such that the metal layer 110 only remains under the various signal and routing traces. Specifically, one routing trace may include the metal routing 110 and conductive elements 145 and 170. Another routing trace may include the metal layer 110 and conductive element 147. Another routing trace may include the metal layer 110 and conductive elements 140 and 175. The power traces 197 and 199 may further include segmented portions of the metal layer 110 and conductive elements 150 and 180 as previously described. The power traces 197 and 199 may have surfaces 196 and 194, respectively.

As can be seen from FIG. 10 and the above description, the package 100 may include various of the following benefits. For example, because the power traces 197 and 199 were generated using an SAP technique followed by SE, the surfaces 194 and 196 may be relatively flat, as opposed to domed as may have been the case in legacy power traces. For example, "flat" here may refer to the surfaces 194 and 196 being generally parallel to the surface of the substrate 105 to which the various traces are coupled. This flatness may allow a benefit of allowing a component to couple more thoroughly with the surfaces 194 and 196 of the power traces 197 and 199. Specifically, more of the surface 194 and 196 may make contact with a component such as memory, a processor, etc. and the greater amount of contact may allow for more efficient power transfer from the power trace to the component. In addition, as can be seen in FIG. 10, the power traces 197 and 199 may have a relatively rectangular or square-shaped cross sectional profile, which may allow for increased power efficiency as described above.

Additionally, the combination of the SAP and SE techniques may allow power traces with a sub 2:1 space to thickness ratio. For example, in some embodiments the power traces 197 and 199 may have a space:thickness ratio of less than 1.5:1. In some embodiments the ratio may be as low as 1.2:1 and, in embodiments where the SE process is a light activated SE process, the space:thickness ratio may be less than 1:1. As used herein, space:thickness ratio may refer to the relative widths of, for example, cavity 195 and power trace 197 or 199. In various embodiments, the routing traces (as described above), may have a space:thickness ratio of approximately 1:1.

FIG. 11 depicts an embodiment of a package 200 that may be similar to package 100. Specifically, the package 200 may include a substrate 205 that may be similar to substrate 105. The package 200 may include a plurality of routing traces that may be similar to the routing traces of package 100. Specifically, the package 200 may include a routing trace formed of a metal layer 210, a conductive element 245, and a conductive element 270, which may be respectively similar to metal layer 110, conductive element 145, and conductive element 170. Similarly, the package 200 may include a routing trace formed of metal layer 210 and conductive element 247, which may be respectively similar to metal layer 110 and conductive element 147.

As can be seen in FIG. 11, the routing traces may have sides (which may also be referred to as a "side face" of the trace) that are generally linear and sloped from the substrate 205 to the top of the routing trace. For example, side 207 of conductive element 245 may generally linearly slope from the metal layer 210 to the top 211 of the conductive element 245. Additionally, side 209 of conductive element 270 may be generally linear and slope from conductive element 245 to the top 213 of conductive element 270. Similarly, conductive element 247 may have a side 201 that generally linearly slopes from the metal layer 210 to the top 251 of the conductive element 247. Generally, this linear sloping nature of the routing traces may be consistent with an SAP profile. That is, traces generated by SAP may have sides that generally linearly slope from the substrate 205 to the top of the trace.

In other embodiments, the slope of the routing traces may be reversed from the embodiment shown in FIG. 11. Specifically, in some embodiments if the cavities such as cavities 125/126/130/160/165 are formed using a laser drill, the slope of the sides 207, 209, 201, etc. may be reversed from that shown in FIG. 11. Specifically, the tops 211/213/251 of the various conductive elements may be wider than the portions of the various conductive elements closest to the substrate 205.

FIG. 12 depicts an embodiment of a package 300 that may be similar to package 100. Specifically, the package 300 may include a substrate 305 that may be similar to substrate 105 of package 100. The package 300 may include a plurality of power traces such as power traces 399 and 397, which may be similar to power traces 197 and 199. The power traces 399 and 397 may include portion of metal layer 310 (which may be similar to metal layer 110) and have sides 301 and 307, respectively. Specifically, the sides (which may also be referred to as a "side face" of the trace) 301 and 307 may be in a cavity 395 which may be similar to cavity 195.

In embodiments, the power traces 399 and 397 may have sides that are consistent with an SE process. Specifically, the sides 301 and 307 may be viewed as concave or "hour glass" shaped. Power trace 399 has a side 301 that is generally concave between the metal layer 310 and the top 394 of power trace 399. By contrast, power trace 399 has a side 307 that is generally concave in that it slopes downward from the top 396 of the power trace 397 to the metal layer 310.

In embodiments, even though the routing traces of package 100 are depicted as having generally vertical sides, it will be understood that in embodiments the routing traces of package 100 may have sides that are generally linearly sloped such as depicted with respect to package 200. Similarly, the power traces of package 100 may have generally concave sides such as the sides of power traces 399 and 397 of package 300. It will also be understood that the degree to which the sides of package 200 are sloped, or the degree to which the sides of power traces 399 and 397 of package 300 are concave, are depicted herein as examples for the sake of understanding. In other embodiments, the sides may not be as sloped or as concave as depicted.

It will be understood that the above packages 100, 200, and 300 are intended as examples. Specifically, the specific sizes, widths, relative sizes, number of elements, etc. depicted in the various FIGS. 1-12 are intended as examples. Other embodiments may have, for example, more or fewer layers. Some embodiments may have more or fewer traces such as the various signal or power traces. In some embodiments, even though the various elements of FIGS. 1-12 may be referred to as traces, in some embodiments the elements may be pads. Specifically, in some embodiments elements 199 or 197 may be pads rather than traces. Similarly, one or more of the various routing traces may be pads in other embodiments. In some embodiments, even though various of the routing traces may be depicted with relatively flat or square-shaped tops, in some embodiments the routing traces may have rounded or domed tops due to their formation by an SAP technique. In some embodiments, various of the elements may be performed in a different order or at a different stage of FIGS. 1-10. For example, in some embodiments the metal layer 110 may be segmented prior to the stage depicted in FIG. 10. Additionally, in some embodiments the metal layer 210 may be sloped similarly to the sides 207, 209, 201, etc. In some embodiments the metal layer 310 may also be at least partially concave rather than squared off as depicted in FIG. 12. Various other alternative embodiments may be envisioned.

Figure 13:
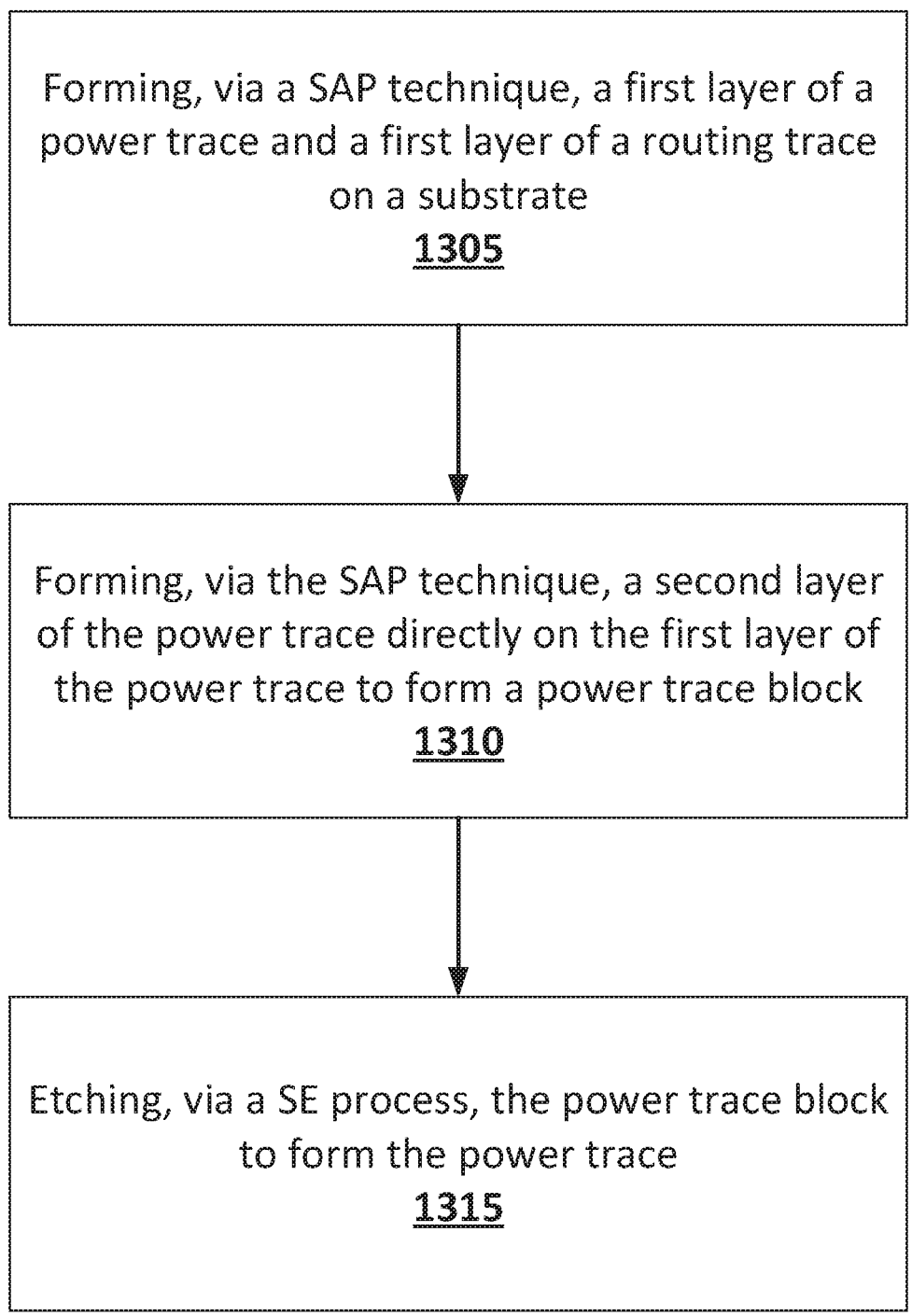
FIG. 13 illustrates a technique for making a package with a dual metal thickness power trace, in accordance with various embodiments.

FIG. 13 depicts an example technique that may be used to generate a package such as packages 100, 200, or 300. The technique may include forming, at 1305 via an SAP technique, a first layer of a power trace and a first layer of a routing trace on a substrate. The first layer may be, for example, conductive elements 145, 147, 140, and 150 of FIG. 3 that are formed on substrate 105.

The technique may further include forming, at 1310 via the SAP technique, a second layer of the power trace directly on the first layer of the power trace to form a power trace block. The second layer of the power trace may be, for example, conductive element 180 of FIG. 6. As noted above, conductive elements 150 and 180 may together form a power trace block.

The technique may further include etching, via an SE process, the power trace block to form the power trace at 1315. Specifically, the power trace block may be etched to form power traces such as power traces 197/199/397/399. Doing so may provide a package such as packages 100, 200, or 300 that include benefits of both SAP and SE techniques as described above.

Figure 14:
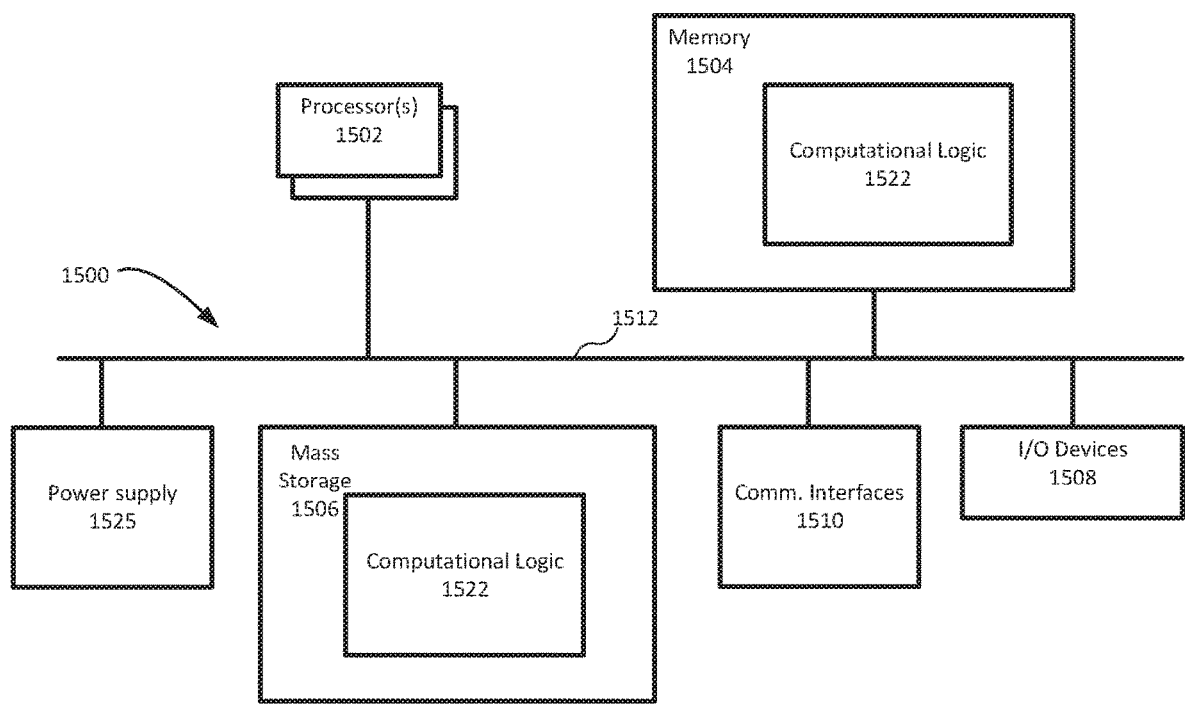
FIG. 14 illustrates an example device that may use the package of FIG. 10, 11, or 12, in accordance with various embodiments.

FIG. 14 illustrates an example computing device 1500 suitable for use with packages 100, 200, or 300 (collectively, "packages 100-300"), in accordance with various embodiments. Specifically, in some embodiments, the computing device 1500 may include one or more of packages 100-300 therein.

As shown, computing device 1500 may include one or more processors or processor cores 1502 and system memory 1504. For the purpose of this application, including the claims, the terms "processor" and "processor cores" may be considered synonymous, unless the context clearly requires otherwise. The processor 1502 may include any type of processors, such as a CPU, a microprocessor, and the like. The processor 1502 may be implemented as an integrated circuit having multi-cores, e.g., a multi-core microprocessor. The computing device 1500 may include mass storage devices 1506 (such as diskette, hard drive, volatile memory (e.g., DRAM, compact disc read-only memory (CD-ROM), digital versatile disk (DVD), and so forth)). In general, system memory 1504 and/or mass storage devices 1506 may be temporal and/or persistent storage of any type, including, but not limited to, volatile and non-volatile memory, optical, magnetic, and/or solid state mass storage, and so forth. Volatile memory may include, but is not limited to, static and/or DRAM. Non-volatile memory may include, but is not limited to, electrically erasable programmable read-only memory, phase change memory, resistive memory, and so forth.

The computing device 1500 may further include input/output (I/O) devices 1508 (such as a display (e.g., a touchscreen display), keyboard, cursor control, remote control, gaming controller, image capture device, and so forth) and communication interfaces 1510 (such as network interface cards, modems, infrared receivers, radio receivers (e.g., Bluetooth), and so forth).

The communication interfaces 1510 may include communication chips (not shown) that may be configured to operate the device 1500 in accordance with a Global System for Mobile Communication (GSM), General Packet Radio Service (GPRS), Universal Mobile Telecommunications System (UMTS), High Speed Packet Access (HSPA), Evolved HSPA (E-HSPA), or Long-Term Evolution (LTE) network. The communication chips may also be configured to operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chips may be configured to operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication interfaces 1510 may operate in accordance with other wireless protocols in other embodiments.

The computing device 1500 may further include or be coupled with a power supply 1525. The power supply 1525 may, for example, be a power supply that is internal to the computing device 1500 such as a battery. In other embodiments the power supply 1525 may be external to the computing device 1500. For example, the power supply 1525 may be an electrical source such as an electrical outlet, an external battery, or some other type of power supply. The power supply 1525 may be, for example alternating current (AC), direct current (DC) or some other type of power supply. The power supply 1525 may in some embodiments include one or more additional components such as an AC to DC convertor, one or more downconverters, one or more upconverters, transistors, resistors, capacitors, etc. that may be used, for example, to tune or alter the current or voltage of the power supply from one level to another level. In some embodiments the power supply 1525 may be configured to provide power to the computing device 1500 or one or more discrete components of the computing device 1500 such as the processor(s) 1502, mass storage 1506, I/O devices 1508, etc.

The above-described computing device 1500 elements may be coupled to each other via system bus 1512, which may represent one or more buses. In the case of multiple buses, they may be bridged by one or more bus bridges (not shown). Each of these elements may perform its conventional functions known in the art. The various elements may be implemented by assembler instructions supported by processor(s) 1502 or high-level languages that may be compiled into such instructions.

The permanent copy of the programming instructions may be placed into mass storage devices 1506 in the factory, or in the field, through, for example, a distribution medium (not shown), such as a compact disc (CD), or through communication interface 1510 (from a distribution server (not shown)). That is, one or more distribution media having an implementation of the agent program may be employed to distribute the agent and to program various computing devices.

The number, capability, and/or capacity of the elements 1508, 1510, 1512 may vary, depending on whether computing device 1500 is used as a stationary computing device, such as a set-top box or desktop computer, or a mobile computing device, such as a tablet computing device, laptop computer, game console, or smartphone. Their constitutions are otherwise known, and accordingly will not be further described.

In various implementations, the computing device 1500 may comprise one or more components of a data center, a laptop, a netbook, a notebook, an ultrabook, a smartphone, a tablet, a personal digital assistant (PDA), an ultra mobile PC, a mobile phone, or a digital camera. In further implementations, the computing device 1500 may be any other electronic device that processes data.

In some embodiments, as noted above, computing device 1500 may include one or more of packages 100-300. For example, in some embodiments the processor 1502, memory 1504, or some other component of the computing device 1500 may be coupled with one or more of the routing traces of one of packages 100-300. Further, in some embodiments the power supply 1525 may be coupled with one or more of the power traces of one of packages 100-300.

EXAMPLES

Example 1 includes a semiconductor package comprising: a substrate; a routing trace coupled with the substrate, wherein a side of the routing trace between the substrate and a top of the routing trace is linear; and a power trace coupled with the substrate, wherein a side of the power trace between the substrate and a top of the power trace is linear.

Example 2 includes the semiconductor package of example 1, wherein the routing trace has a profile consistent with a semi-additive plating (SAP) technique and the power trace has a profile consistent with a subtractive etch (SE) technique.

Example 3 includes the semiconductor package of example 1, wherein the routing trace and the power trace include copper.

Example 4 includes the semiconductor package of example 3, wherein the power trace includes two layers of copper directly coupled with one another.

Example 5 includes the semiconductor package of any of examples 1-4, wherein the power trace is a power trace of a plurality of power traces, and wherein the plurality of power traces have a space to thickness ratio of less than 2:1.

Example 6 includes the semiconductor package of example 5, wherein the plurality of power traces have a space to thickness ratio of less than or equal to 1.5:1.

Example 7 includes the semiconductor package of any of examples 1-4, wherein the power trace is to route power between a component coupled with the power trace and a power supply.

Example 8 includes the semiconductor package of any of examples 1-4, wherein the routing trace is to carry data signals to or from a component coupled with the routing trace.

Example 9 includes the semiconductor package of any of examples 1-4, wherein the top of the power trace is flat as measured in a plane parallel to a face of the substrate.

Example 10 includes a method of generating a substrate with a power trace and a routing trace positioned thereon, the method comprising: forming, via a semi-additive plating (SAP) technique, a first layer of the power trace and a first layer of the routing trace on the substrate; forming, via the SAP technique, a second layer of the power trace directly on the first layer of the power trace to form a power trace block; and etching, via a subtractive etch (SE) process, the power trace block to form the power trace.

Example 11 includes the method of example 10, further comprising forming, via the SAP technique, a second layer of the routing trace directly on the first layer of the routing trace.

Example 12 includes the method of example 10, wherein the routing trace is not etched via the SE process when the power trace block is etched.

Example 13 includes the method of example 10, wherein the etching includes chemical, optical, or mechanical etching.

Example 14 includes the method of example 10, wherein the routing trace and the power trace include copper.

Example 15 includes the method of any of examples 10-14, wherein the power trace is a power trace of a plurality of power traces, and wherein the plurality of power traces have a space to thickness ratio of less than 2:1.

Example 16 includes the method of example 15, wherein the plurality of power traces have a space to thickness ratio of less than or equal to 1.5:1.

Example 17 includes the method of any of examples 10-14, wherein the power trace is to route power between a component coupled with the power trace and a power supply.

Example 18 includes the method of any of examples 10-14, wherein the routing trace is to carry data signals to or from a component coupled with the routing trace.

Example 19 includes a computing system comprising: a processor; a power supply; and a semiconductor package, wherein the semiconductor package includes: a substrate; a routing trace coupled with the substrate and communicatively coupled with the processor, wherein the routing trace is linear on a side of the routing trace between the substrate and a top of the routing trace and has a profile consistent with a semi-additive plating (SAP) technique; and a power trace coupled with the substrate and communicatively coupled with the power supply, wherein the power trace is concave on a side of the power trace between the substrate and a top of the power trace and has a profile consistent with a subtractive etch (SE) technique.

Example 20 includes the computing system of example 19, wherein the routing trace and the power trace include copper.

Example 21 includes the computing system of example 20, wherein the power trace includes two layers of copper directly coupled with one another.

Example 22 includes the computing system of any of examples 19-21, wherein the power trace is a power trace of a plurality of power traces, and wherein the plurality of power traces have a space to thickness ratio of less than 2:1.

Example 23 includes the computing system of example 22, wherein the plurality of power traces have a space to thickness ratio of less than or equal to 1.5:1.

Example 24 includes the computing system of any of examples 19-21, wherein the top of the power trace is flat as measured in a plane parallel to a face of the substrate.

Example 25 includes a semiconductor package comprising: a routing trace with a linearly sloped side face; and a power trace with a concave side face, wherein the power trace is made up of two separate layers of conductive material.

Example 26 includes the semiconductor package of example 25, wherein the routing trace and the power trace are coupled with a substrate.

Example 27 includes the semiconductor package of example 25, wherein a top of the power trace is parallel to a face of the substrate to which the routing trace and the power trace are coupled.

Example 28 includes the semiconductor package of any of examples 25-27, wherein the routing trace has a profile consistent with a semi-additive plating (SAP) technique.

Example 29 includes the semiconductor package of any of examples 25-27, wherein the power trace has a profile consistent with a subtractive etch (SE) technique.

Example 30 includes the semiconductor package of any of examples 25-27, wherein the routing trace and the power trace include copper.

Example 31 includes the semiconductor package of any of examples 25-27, wherein the two separate layers of conductive material are layers of copper coupled directly with one another.

Example 32 includes the semiconductor package of any of examples 25-27, wherein the power trace is a power trace of a plurality of power traces, and wherein the plurality of power traces have a space to thickness ratio of less than 2:1.

Example 33 includes the semiconductor package of example 32, wherein the plurality of power traces have a space to thickness ratio of less than or equal to 1.5:1.

Example 34 includes the semiconductor package of any of examples 25-27, wherein the power trace is to route power between a component coupled with the power trace and a power supply.

Example 35 includes the semiconductor package of any of examples 25-27, wherein the routing trace is to carry data signals to or from a component coupled with the routing trace.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations of the present disclosure, including what is described in the Abstract, is not intended to be exhaustive or to limit the present disclosure to the precise forms described. While specific implementations of, and examples for, the present disclosure are described herein for illustrative purposes, various equivalent modifications are possible within the scope of the present disclosure, as those skilled in the relevant art will recognize.

These modifications may be made to the present disclosure in light of the above detailed description. The terms used in the following claims should not be construed to limit the present disclosure to the specific implementations disclosed in the specification and the claims. Rather, the scope of the present disclosure is to be determined entirely by the following claims, which are to be construed in accordance with established doctrines of claim interpretation.

The invention claimed is:

1. A semiconductor package comprising:
a substrate;
a routing trace over a first portion of the substrate, wherein a side of the routing trace between the substrate and a top of the routing trace is linearly sloped; and
a power trace over a second portion of the substrate, wherein a side of the power trace between the substrate and a top of the power trace is concave,
wherein:
the routing trace and the power trace are coplanar and wherein a top surface of the power trace is substantially flat,
an individual trace of the routing trace and the power trace includes a first metal, a second metal, and a third metal,
the second metal is between the first metal and the third metal,
the first metal is between the substrate and the second metal, and
two or more of the first metal, the second metal, and the third metal have different material compositions.

2. The semiconductor package of claim 1, wherein the routing trace has a profile consistent with a semi-additive plating (SAP) technique and the power trace has a profile consistent with a subtractive etch (SE) technique.

3. The semiconductor package of claim 1, wherein the routing trace and the power trace include copper.

4. The semiconductor package of claim 1, wherein the power trace is a power trace of a plurality of power traces, and wherein the plurality of power traces have a space to thickness ratio of less than 2:1.

5. The semiconductor package of claim 1, wherein the power trace is to route power between a component coupled with the power trace and a power supply.

6. The semiconductor package of claim 1, wherein the routing trace is to carry data signals to or from a component coupled with the routing trace.

7. The semiconductor package of claim 1, wherein the top of the power trace is flat as measured in a plane parallel to a face of the substrate.

8. A method of forming a semiconductor package, the method comprising:
forming a routing trace over a first portion of a substrate, wherein a side of the routing trace between the substrate and a top of the routing trace is linearly sloped; and
forming a power trace over a second portion of the substrate, wherein a side of the power trace between the substrate and a top of the power trace is concave; and
wherein:
the routing trace and the power trace are coplanar and wherein a top surface of the power trace is substantially flat, an individual trace of the routing trace and the power trace includes a first metal, a second metal, and a third metal, the second metal is between the first metal and the third metal, the first metal is between the substrate and the second metal, and two or more of the first metal, the second metal, and the third metal have different material compositions.

9. The method of claim 8, wherein the routing trace is formed using a semi-additive plating (SAP) technique.

10. The method of claim 8, wherein the routing trace is not etched via a subtractive etch (SE) process.

11. The method of claim 8, wherein the power trace is formed using a subtractive etch (SE) process.

12. The method of claim 8, wherein the routing trace and the power trace include copper.

13. The method of claim 8, wherein the power trace is a power trace of a plurality of power traces, and wherein the plurality of power traces have a space to thickness ratio of less than 2:1.

14. The method of claim 8, wherein the power trace is to route power between a component coupled with the power trace and a power supply.

15. The method of claim 8, wherein the routing trace is to carry data signals to or from a component coupled with the routing trace.

16. A computing system comprising:
a processor;
a power supply; and
a semiconductor package, wherein the semiconductor package includes:
a substrate;
a routing trace over a first portion of the substrate and communicatively coupled with the processor, wherein the routing trace is linear on a side of the routing trace between the substrate and a top of the routing trace and has a profile consistent with a semi-additive plating (SAP) technique; and
a power trace over a second portion of the substrate and communicatively coupled with the power supply, wherein the power trace is concave on a side of the power trace between the substrate and a top of the power trace and has a profile consistent with a subtractive etch (SE) technique,
wherein the routing trace and the power trace are coplanar, wherein each of the routing trace and the power trace includes a first metal, a second metal, and a third metal, wherein the second metal is between the first metal and the third metal, wherein the first metal is between the substrate and the second metal, and wherein two or more of the first metal, the second metal, and the third metal have different material compositions.

17. The computing system of claim 16, wherein the routing trace and the power trace include copper.

18. The computing system of claim 16, wherein the power trace is a power trace of a plurality of power traces, and wherein the plurality of power traces have a space to thickness ratio of less than 2:1.

19. The computing system of claim 18, wherein the plurality of power traces have a space to thickness ratio of less than or equal to 1.5:1.

20. The computing system of claim 16, wherein the top of the power trace is flat as measured in a plane parallel to a face of the substrate.

21. A semiconductor package comprising:
a routing trace with a linearly sloped side face; and
a power trace with a concave side face,
wherein the routing trace and the power trace are coplanar and wherein a top surface of the power trace is substantially flat, wherein at least one of the routing trace and the power trace includes a first metal, a second metal, and a third metal, wherein the second metal is between the first metal and the third metal, wherein the first metal is between the substrate and the second metal, and wherein two or more of the first metal, the second metal, and the third metal have different material compositions.

22. The semiconductor package of claim 21, wherein the routing trace and the power trace are coupled with a substrate.

23. The semiconductor package of claim 21, wherein a top of the power trace is parallel to a face of the substrate to which the routing trace and the power trace are coupled.

24. The semiconductor package of claim 21, wherein the routing trace has a profile consistent with a semi-additive plating (SAP) technique.

25. The semiconductor package of claim 21, wherein the power trace has a profile consistent with a subtractive etch (SE) technique.

* * * * *